United States Patent
Jones

(10) Patent No.: US 10,663,505 B2
(45) Date of Patent: May 26, 2020

(54) TEST SYSTEM AND TEST METHOD FOR PERFORMING EMC TEST EFFICIENTLY

(71) Applicant: Rohde & Schwarz GmbH & Co. KG, Munich (DE)

(72) Inventor: Doug Jones, Carrollton, TX (US)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 275 days.

(21) Appl. No.: 15/371,944

(22) Filed: Dec. 7, 2016

(65) Prior Publication Data

US 2018/0157914 A1 Jun. 7, 2018

(51) Int. Cl.
| | | |
|---|---|---|
| G11B 27/34 | (2006.01) | |
| H04N 5/77 | (2006.01) | |
| G01R 31/00 | (2006.01) | |
| G06K 9/00 | (2006.01) | |
| H04N 7/18 | (2006.01) | |
| G11B 27/00 | (2006.01) | |

(52) U.S. Cl.
CPC ......... *G01R 31/001* (2013.01); *G01R 31/002* (2013.01); *G06K 9/00771* (2013.01); *G11B 27/005* (2013.01); *G11B 27/34* (2013.01); *H04N 5/77* (2013.01); *H04N 7/183* (2013.01); *G06K 2009/00738* (2013.01)

(58) Field of Classification Search
CPC ........ H04N 7/183; H04N 5/77; G11B 27/005; G11B 27/34; G01R 31/001
See application file for complete search history.

(56) References Cited

U.S. PATENT DOCUMENTS

| | | | | |
|---|---|---|---|---|
| 6,700,388 | B1* | 3/2004 | Mayor | G01R 29/0892 324/537 |
| 8,327,407 | B2* | 12/2012 | Lucas | H04N 21/40 725/110 |
| 9,154,777 | B2 | 10/2015 | He | |
| 2002/0081091 | A1* | 6/2002 | Tada | H04N 5/76 386/291 |
| 2016/0365113 | A1* | 12/2016 | Matsuoka | G11B 27/005 |
| 2018/0098082 | A1* | 4/2018 | Burns | H04N 19/117 |
| 2018/0173614 | A1* | 6/2018 | Gong | G06F 11/3664 |

OTHER PUBLICATIONS

CE-SYS GmbH Ilmenau "Kurzanleitung EMV-Kamera CE-CAM/10,20,30", Am Hammergrund 1, D98693 Ilmenau, retrieved on Dec. 7, 2016 from "http://www.ce-sys-ilmenau.de/dokumente/kurzanleitung-cecam.pdf", 6 pages.

* cited by examiner

*Primary Examiner* — Thai Q Tran
*Assistant Examiner* — Jose M Mesa
(74) *Attorney, Agent, or Firm* — Ditthavong & Steiner, P.C.

(57) ABSTRACT

A test system for performing a test on a device under test is provided. The test system comprises, at least one test device, configured for performing the test on the device under test, and at least one camera, configured for recording video data of the device under test and/or the at least one test device. Moreover, the test system comprises a storage unit, which is configured for storing the recorded video data and a video reproduction unit, which is configured for reproducing the recorded video. The video reproduction unit is moreover configured for reproducing the recorded video at an adjustable speed.

15 Claims, 3 Drawing Sheets

TEST SYSTEM AND TEST METHOD FOR PERFORMING EMC TEST EFFICIENTLY

TECHNICAL FIELD

The invention relates to a test system and a test method for performing tests on a device under test. Especially, the invention relates to performing electromagnetic compatibility tests on the device under test. The device under test is for example a mobile telephone.

BACKGROUND ART

During the development of electronic products, an electromagnetic compatibility test is an important test to ensure a safe and reliable operation of the device under test. For performing such tests, the device under test is subjected to electromagnetic radiation of different frequencies and strengths, while the reaction of the device under test is monitored. In order to limit outside influences and in order to protect test operators, electromagnetic compatibility tests are usually performed in a test chamber, which is insulated with regard to electromagnetic radiation. This makes it difficult though for a test operator to monitor the behavior of the device under test.

There exist solutions to this issue, which use a camera, which is mounted inside the test chamber together with the device under test. Such a system is shown in the U.S. Pat. No. 9,154,777 B2.

Such systems though have the disadvantage that they require a great deal of time, in which the test operator watches the monitor connected to the video camera. Alternatively, when the video is recorded, a great deal of time is necessary for reviewing the resulting videos.

Accordingly, one object of the invention among others is to provide a system and method for performing tests on devices under test, which allow a monitoring of the device under test without requiring great lengths of operator time.

SUMMARY OF THE INVENTION

According to a first aspect of the invention, a test system for performing a test on a device under test is provided. The test system comprises at least one test device, configured for performing the test on the device under test, and at least one camera, configured for recording video data of the device under test and/or the at least one test device. Moreover, the test system comprises a storage unit, which is configured for storing the recorded video data and a video reproduction unit, which is configured for reproducing the recorded video. The video reproduction unit is moreover configured for reproducing the recorded video at an adjustable speed. This allows the operator to review the video of the recorded test in a faster manner than real-time. This enables a quicker evaluation of the test results.

Preferably the test system comprises a test chamber in which the device under test is arranged.

According to a preferred implementation form of the first aspect, the at least one test device, the at least one camera, and the device under test are arranged within the test chamber. This allows for a safe performing of the test. Also an influence of test results by stray electromagnetic emissions is prevented.

According to a further preferred implementation form of the first aspect, the test chamber is an electromagnetic compatibility test chamber. The test performed by the at least one test device is an electromagnetic compatibility test on the device under test. Especially in these test circumstances, an increase of test speed can be achieved.

According to a further preferred implementation form of the first aspect, the test system moreover comprises a video transformation unit, which allows for transforming the recorded video data to different video formats and/or sizes and/or qualities. This allows for an efficient further processing of the video data.

According to a further preferred implementation form of the first aspect, the at least one camera comprises an interface for transferring the recorded video data to an external storage unit. It is thereby possible to have the storage of the video data outside of the test chamber. This reduces the requirements regarding the electromagnetic compatibility of the storage.

According to a further preferred implementation form of the first aspect, the test system moreover comprises an event determining unit, which is configured for automatically determining events within the recorded video data, based upon set event conditions. This allows for an automation of the determining of events relevant to the electromagnetic compatibility test. This further reduces the operator time necessary for evaluating the test results.

According to a further preferred implementation form of the first aspect, the event determining unit is configured by the event conditions for determining pixel changes in a pre-specified first area of the image between consecutive frames of the recorded video data, determining a number of determined pixel changes, and determining an event if the determined number of pixel changes surpasses a pre-specified first threshold. It is thereby possible to determine test-relevant events in a very simple manner.

According to a further preferred implementation form of the first aspect, the event determining unit is configured by the event conditions for performing an optical character recognition of characters displayed by the device under test or the at least one test device, recorded in a pre-specified second area of the image of the recorded video data. It is thereby possible to base the determining of an event on a measurement result of the at least one test device or a text displayed on a display of the device under test. This allows for a very simple and efficient determining of test relevant events.

According to a further preferred implementation form of the first aspect, the event determining unit is configured by the event conditions for determining a numerical value from the determined characters and determining an event if the numerical value changes by at least a pre-specified value or increases beyond a pre-specified second threshold or decreases beyond a pre-specified third threshold. This allows for an especially accurate determining of an event.

According to a further preferred implementation form of the first aspect, the event determining unit is configured by the event conditions for determining an event if the recognized characters change to a pre-specified text. This also allows for a very accurate determining of a test-relevant event.

According to a further preferred implementation form of the first aspect, the test system moreover comprises an event condition setting unit, which is configured for setting the event conditions by a user. It is thereby possible to very flexibly control the evaluation of the test results.

According to a further preferred implementation form of the first aspect, the test system moreover comprises an event notification unit, which is configured for notifying a user of determined events by visual and/or haptic and/or audio signaling. This further allows the user to spend less time for evaluating the test results.

According to a further preferred implementation form of the first aspect, the storage unit is configured for storing determined events. It is thereby very easily possible to review the test results including the respective events at a later time.

According to a further preferred implementation form of the first aspect, the video reproduction unit is configured for successively reproducing the recorded video during each determined event and/or during a pre-determined first time interval before each determined event and/or during a pre-determined second time interval after each determined event. The video reproduction unit is moreover configured for not reproducing the recorded video at any other instance of time. This allows the user to review only the most relevant parts of the recorded video data while sparing him to review ever-unchanging non-relevant parts of the recorded video.

According to a further preferred implementation form of the first aspect, the video reproduction unit is configured for successively jumping to each determined event or to a pre-determined time duration before each determined event when reproducing the recorded video. Also this alternative construction allows the test operator to review only the most important parts of the recorded video.

According to a second aspect of the invention, a method for performing a test on a device under test is provided. The method comprises performing the test on a device under test by at least one test device, recording video data of the device under test and/or the at least one test device by a camera during performing the test, storing the recorded video data and reproducing the recorded video data at an adjustable speed. This allows the operator to review the video of the recorded test in a faster manner than real-time. This enables a quicker evaluation of the test results.

Preferably the device under test is arranged in a test chamber.

BRIEF DESCRIPTION OF THE DRAWINGS

An exemplary embodiment of the invention is now further explained by way of example only with respect to the drawings, in which.

DETAILED DESCRIPTION OF THE PREFERRED EMBODIMENTS

Figure 1:
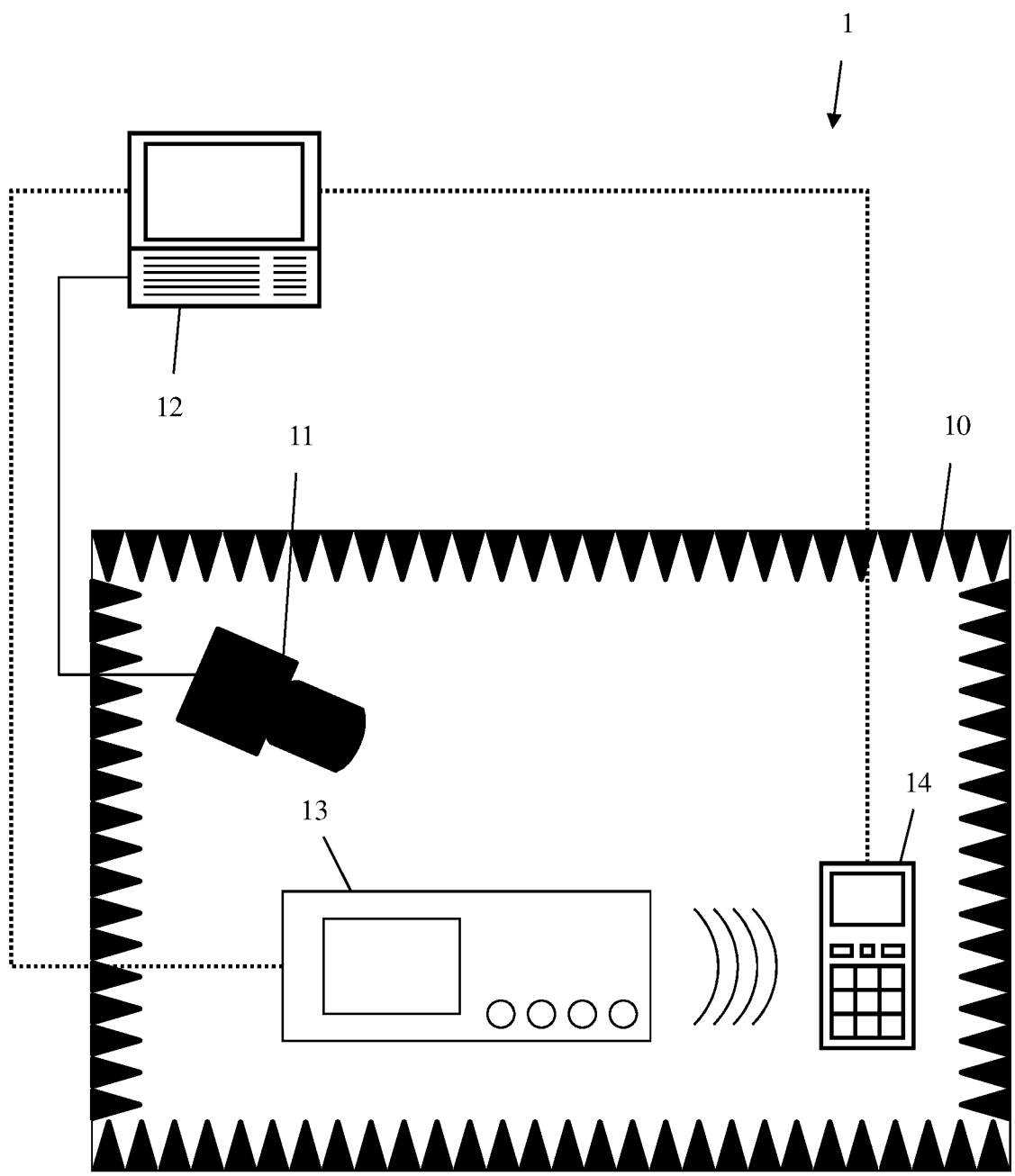
FIG. 1 shows a first embodiment of the test system according to the first aspect of the invention.

First we demonstrate the general construction and function of an embodiment of the test system according to the first aspect along FIG. 1. Along FIG. 2, the construction of some details of the test system, especially relevant to the evaluation of the recorded video data is shown along FIG. 2. Finally, with regard to FIG. 3, the function of an embodiment of the test method according to the second aspect of the invention is shown. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the test system 1 according to the first aspect of the invention is shown. The test system comprises a test chamber 10, a camera 11, an evaluation unit 12 and a test device 13. The camera 11, the test device 13 and a device under test 14 are located within the test chamber 10. The evaluation unit 12 is not located within the test chamber 10 in this example. The evaluation unit 12 though could also be located within the test chamber 10. Also it is possible that the evaluation unit 12 and the camera 11 are manufactured as one single device, which is placed within the test chamber 10.

For example, the device under test 13 is a mobile telephone or a router or a measuring device or any other type of electronic device. The at least one test device 13 for example is a signal generator connected to an antenna, which is configured for generating the electromagnetic signal directed at the device under test for performing an electromagnetic compatibility test.

Also it is important to note that although only a single camera 11 and a single test device 13 are depicted, also the use of a plurality of cameras and/or a plurality of test devices is possible.

The camera 11 is connected to the evaluation unit 12. For example this connection is an electrically conductive cable. Alternatively, also an optical fiber can be used for this connection. Optionally, additional connections between the evaluation unit 12 and the test device 13 and/or between the evaluation unit 12 and the device under test 14 are possible.

Regarding the connection between the evaluation unit 12 and the camera 11, the test device 13 and the device under test 14, it is important to note that these connections do not have to be present at all times. If the camera comprises a temporary storage for recording the video data, it is possible to operate the camera within the test chamber 10 without any connections to the outside world. In this case, the camera additionally comprises a battery based power supply. Only after performing the tests, the recorded video data is then transferred to the evaluation unit 12, stored there and evaluated.

Through the connection between the evaluation unit 12 and the camera 11, recorded video data, which is produced by the camera, is transferred to the evaluation unit 12, where it is stored and evaluated. Regarding the function of the evaluation unit 12, it is referred to later elaborations regarding FIG. 2.

Through the connection between the evaluation unit 12 and the test device 13, it is possible to control the functions of the device 13.

Through the connection between the evaluation unit 12 and the device under test 14, it is possible to control the function of the device under test.

Second Embodiment

Figure 2:
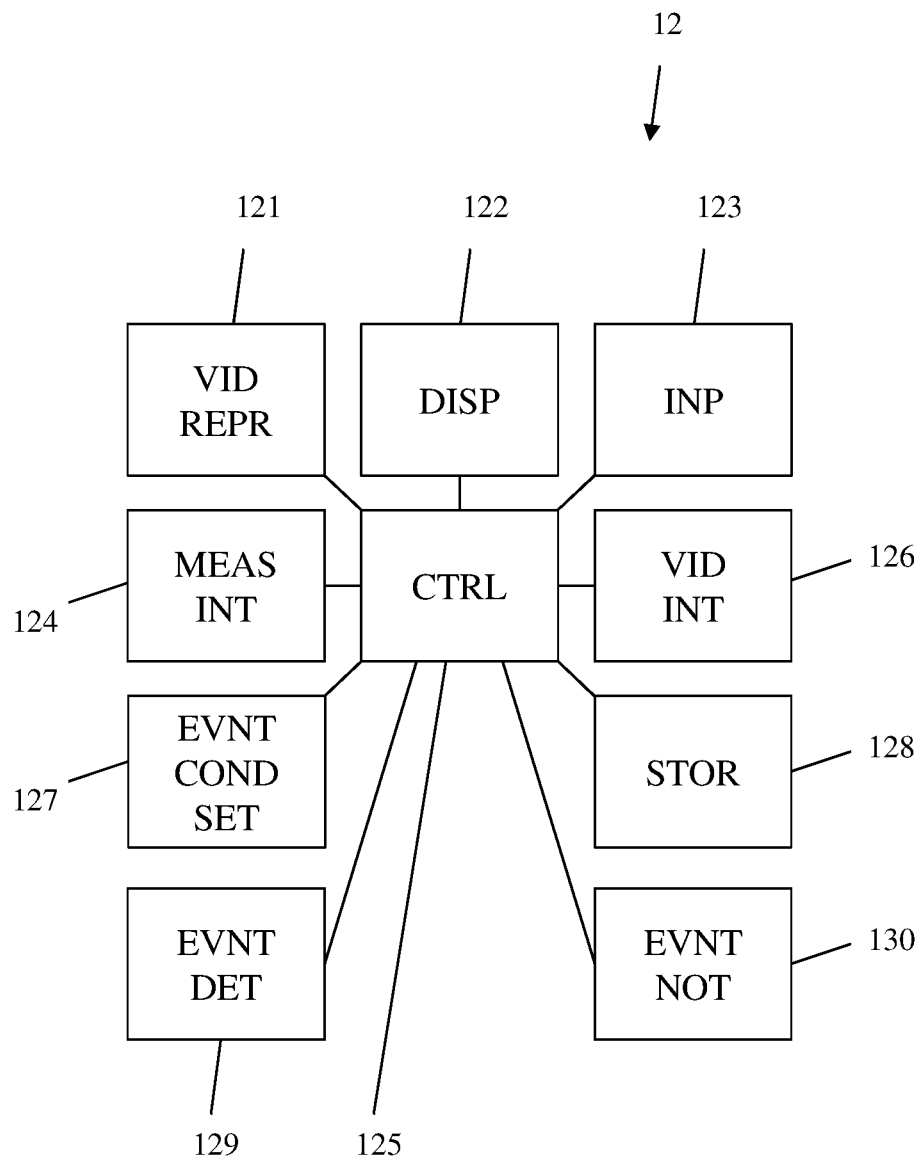
FIG. 2 shows a detail of a second embodiment of the test system of the first aspect of the invention.

In FIG. 2, a second embodiment of the first aspect of the invention is shown. Here, the inner workings of the evaluation unit 12 are shown in detail. The evaluation unit 12 comprises a video reproduction unit 121, a display 122, an input unit 123, a measurement device interface 124, a control unit 125, a video data interface 126, an event condition setting unit 127, a storage unit 128, an event determining unit 129, and an event notifying unit 130. All of the units 121-124, 126-130 are connected to the control unit 125, which is configured for controlling all the other units and passing data between the different units. Within the following, it is mentioned that data is exchanged between the different units, this can either happen trough non-depicted direct connections or through the control unit 125.

After placing the device under test 14 in the test chamber 10, the video interface 126 instructs the camera 11 to begin recording. Moreover, the measurement device interface 124 instructs the measurement device to begin the test on the device under test. If there exists no connection to the measurement device, the measurement device interface 124 is not necessary.

While the test is performed by the at least one test device 13, the storage unit 128 stores the video data recorded by the camera 13, which is provided through the video interface 126. When the tests performed by the at least one test device 13 on the device under test 14 are complete, the video data is finalized within the storage unit 128.

As explained earlier, the recording and storing of the video data can be performed in real time during the performance of the tests on the device under test through connections between the evaluation unit 12 and the camera 11, and optionally the test device 13 and the device under test 14. Alternatively, there exist no connections leaving the test chamber 10 during performing the actual tests. In this case, the camera 11 comprises a temporary storage for storing the video data and an independent power supply, for example a battery. As soon as the tests are finished, the camera is connected to the evaluation unit 12, which then instructs the camera 11 by use of the video interface 126 to transfer the video data through the video interface 126. The video data is then stored in the storage unit 128. In this case, the evaluation unit 12 does not need to comprise a measurement device interface 124.

In both cases, after the video data has been stored by the storage unit 128, the video reproduction unit 121 can read the video data from the storage unit 128 and perform a playback using the display 122 of the evaluation unit 12. The video reproduction unit 121 can perform the playback at a variable speed. This means that the operator can fast forward through less interesting sections of the video data and perform a slow-motion playback of the most important sections of the video data, for example sections, in which test-relevant events occur. Such an event could for example be an error of the device under test produced in reaction to transmitting a specific frequency and signal strength to the device under test in the electromagnetic compatibility test.

Moreover, the event determining unit 129 can automatically determine such events in order to spare the test operator from reviewing the entire amount of recorded video data. In this case the event determining unit 129 analyzes the entire stored video data and determines events based upon event conditions, which are pre-specified. Such event conditions can for example be changes of pixels on displays of the at least one test device 13 and/or the device under test 14, changes of the numerical values displayed on such displays, the display of a specific text on such a display, etc. If a numerical value or a text is to be analyzed, an optical character recognition is performed by the event determining unit 129. Such an event can also be defined as occurring only in a specific region of the recorded video data.

As such events, pre-specified events can be used. Also though it is possible to set such events by a user using the event condition setting unit 127. In order to do this, the user interacts with the evaluation unit 12 by use of the input unit 123, which is for example a mouse or a trackpad. Also the use of a touch sensitive display is possible. In this case, the display 122 and the input unit 123 together form the touch sensitive display.

Therefore, a user can specify which actions within the recorded video data trigger an event. Based on these either pre-specified events or user-set events, the event determining unit 129 analyzes the stored video data. As a 3o result, a list of events with time stamps is produced. For a single event, an event duration or at least an event timing is determined. The type of event and the event timing or event time duration can then be stored along with the video data in the storage unit 128. Moreover, while performing the playback, the video reproduction unit 121 can display the according events in order to raise the awareness of the test operator that an event is presently occurring or has just occurred. Alternatively, the video reproduction unit 121 can automatically fast forward to events or even directly jump to events without displaying the video data in between events. Especially, it is possible to either fast forward or jump directly to the event start time or event timing or to go to a moment before separated from the event timing or the event start by a pre-determined time interval, so that the test operator can see as the event occurs on the stored video data which is reproduced.

In order to make sure that the user does not miss any events, the event notifying unit 130 can notify the user by visual and/or haptic and/or audio signaling that an event is presently occurring. For example, by an audio signal, for example a chime, the user attention is raised.

Third Embodiment

Figure 3:
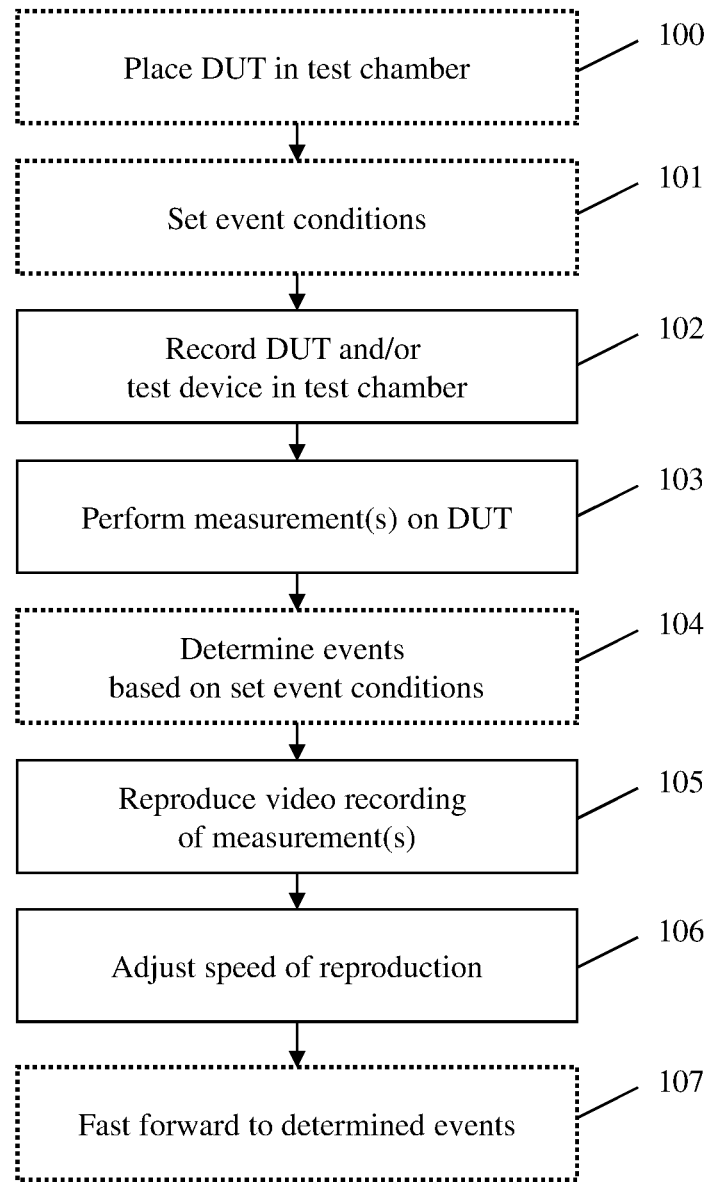
FIG. 3 shows an embodiment of the test method according to the second aspect of the invention.

Finally, in FIG. 3, an embodiment of the test method according to the second aspect of the invention is shown. In an optional first step a device under test is placed in a test chamber. In a second optional step 101, event conditions are set by a user. In a third step 102, the device under test and/or the at least one test device are recorded within the test chamber by at least one camera. In a fourth step 103, measurements are performed on the device under test by the at least one test device. In an optional fifth step 104, events are determined based upon the previously set event conditions. In a sixth step 105, the recorded video data is reproduced. In a seventh step 106, the speed of reproduction is adjusted. In final optional eighth step 107, an automatical fast forward to determined events occurs.

It is noted that the test system and test method according to the different embodiments are very close to each other. Features shown with regard to one of the aspects of the invention are also to be understood to function with the other aspect and are compatible and combinable therewith.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to specific test types, test devices or devices under test. The invention discussed above can be applied to many tests and devices under test. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What is claimed is:

1. A test system for performing a test on a mobile device under test, comprising:
   at least one mobile test device, performing the test on the mobile device under test,
   at least one camera, recording video data of the device under test or the at least one test device,
   storage that stores the recorded video data, and
   a processor configured to reproduce the recorded video,
   wherein the test performed by the at least one mobile test device is an electromagnetic compatibility test on the mobile device under test,
   wherein the processor reproduces the recorded video data at an adjustable speed,
   wherein specified actions within the recorded video data trigger an event,
   wherein the test system comprises an electromagnetic compatibility test chamber, and
   wherein the at least one mobile test device, the at least one camera, and the mobile device under test are arranged within the electromagnetic compatibility test chamber and the storage and processor are arranged external to the electromagnetic compatibility test chamber.

2. The test system according to claim 1,
   wherein the test system comprises a video transformation unit transforming the recorded video data to different video formats or sizes or qualities.

3. The test system according to claim 1,
   wherein the at least one camera comprises an interface for transferring the recorded video data to external storage.

4. The test system according to claim 1,
   wherein the test system comprises an event determining unit automatically determining events within the recorded video data, based upon set event conditions.

5. The test system according to claim 4,
   wherein the event determining unit is configured by the event conditions for determining pixel changes in a pre-specified first area of the image between consecutive frames of the recorded video data,
   determining a number of determined pixel changes, and
   determining an event, when the determined number of pixel changes surpasses a pre-specified first threshold.

6. The test system according to claim 4,
   wherein the event determining unit is configured by the event conditions for performing an optical character recognition of characters displayed by the mobile device under test or the at least one mobile test device recorded in a pre-specified second area of the image of the recorded video data.

7. The test system according to claim 6,
   wherein the event determining unit is configured by the event conditions for determining a numerical value from the determined characters, and
   determining an event, when the numerical value changes by at least a pre-specified value or increases beyond a pre-specified second threshold, or decreases beyond a pre-specified third threshold.

8. The test system according to claim 6,
   wherein the event determining unit is configured by the event conditions for determining an event, when the recognized characters change to a pre-specified text.

9. The test system according to claim 4,
   wherein the test system comprises an event condition setting unit setting the event conditions by a user.

10. The test system according to claim 4,
    wherein the test system comprises an event notification unit notifying a user of determined events by visual or haptic or audio signaling.

11. The test system according to claim 4,
    wherein the storage stores the determined events.

12. The test system according to claim 4,
    wherein the processor successively reproduces the recorded video during each determined event, or
    during a predetermined first time interval before each determined event, or
    during a predetermined second time interval after each determined event, and
    wherein the processor does not reproduce the recorded video of any other instance of time.

13. The test system according to claim 4,
    wherein the processor successively jumps to each determined event or to a predetermined time duration before each determined event when reproducing the recorded video.

14. A method for performing a test on a mobile device under test, comprising:
    performing the test on a mobile device under test by at least one mobile test device,
    wherein the test performed by the at least one test device is an electromagnetic compatibility test on the device under test,
    recording video data of the device under test or the at least one test device by a camera during performing the test,
    storing the recorded video data,
    reproducing the recorded video data at an adjustable speed, and
    specifying actions within the recorded video data that trigger an event,
    wherein the at least one mobile test device, the at least one camera, and the mobile device under test are arranged within an electromagnetic compatibility test chamber, and
    the storing and reproducing steps are performed external to the electromagnetic compatibility test chamber.

15. The method according to claim 14,
    wherein the device under test is arranged within a test chamber.

* * * * *